United States Patent
Tsai et al.

(10) Patent No.: US 9,177,875 B2
(45) Date of Patent: Nov. 3, 2015

(54) ADVANCED PROCESS CONTROL METHOD FOR CONTROLLING WIDTH OF SPACER AND DUMMY SIDEWALL IN SEMICONDUCTOR DEVICE

(71) Applicant: TAIWAN SEMICONDUCTOR MANUFACTURING CO., LTD., Hsinchu (TW)

(72) Inventors: Hsien-Chieh Tsai, Taichung (TW); Tz-Wei Lin, Taichung (TW); Sheng-Jen Yang, Taichung (TW); Hung-Yin Lin, Taichung (TW); Cherng-Chang Tsuei, Hsinchu (TW); Chen-Hsiang Lu, Hsin-Chu (TW)

(73) Assignee: TAIWAN SEMINCONDUCTOR MANUFACTURING CO., LTD., Hsinchu (TW)

( * ) Notice: Subject to any disclaimer, the term of this patent is extended or adjusted under 35 U.S.C. 154(b) by 91 days.

(21) Appl. No.: 14/081,623

(22) Filed: Nov. 15, 2013

(65) Prior Publication Data

US 2015/0140692 A1 May 21, 2015

(51) Int. Cl.
*H01L 21/00* (2006.01)
*H01L 21/66* (2006.01)
*H01L 21/28* (2006.01)

(52) U.S. Cl.
CPC .......... *H01L 22/12* (2013.01); *H01L 21/28132* (2013.01)

(58) Field of Classification Search
None
See application file for complete search history.

(56) References Cited

U.S. PATENT DOCUMENTS

| | | | |
|---|---|---|---|
| 6,586,755 B1* | 7/2003 | Krivokapic et al. | 250/492.21 |
| 7,064,085 B2* | 6/2006 | Chiu et al. | 438/775 |
| 9,040,317 B2* | 5/2015 | Liao et al. | 438/17 |
| 2002/0119647 A1* | 8/2002 | Riley et al. | 438/595 |
| 2005/0054205 A1* | 3/2005 | Tanaka et al. | 438/706 |
| 2006/0019479 A1* | 1/2006 | Chiu et al. | 438/595 |
| 2008/0138915 A1* | 6/2008 | Oguma | 438/8 |
| 2013/0252355 A1* | 9/2013 | Liao et al. | 438/17 |
| 2014/0252429 A1* | 9/2014 | Richter et al. | 257/288 |
| 2014/0308761 A1* | 10/2014 | Kuo et al. | 438/5 |

\* cited by examiner

*Primary Examiner* — David E Graybill
(74) *Attorney, Agent, or Firm* — McDermott Will & Emery LLP (57) ABSTRACT

An advanced process control (APC) method for controlling a width of a spacer in a semiconductor device includes: providing a semiconductor substrate; providing a target width of a gate; forming the gate on the semiconductor substrate, in which the gate has a measured width; depositing a dielectric layer covering the gate, in which the dielectric layer has a measured thickness; providing a target width of the spacer; determining a trim time of the dielectric layer based on the target width of the gate, the measured width of the gate, the target width of the spacer, and the measured thickness of the dielectric layer; and performing a trimming process on the dielectric layer for the determined trim time to form the spacer.

20 Claims, 7 Drawing Sheets

ADVANCED PROCESS CONTROL METHOD FOR CONTROLLING WIDTH OF SPACER AND DUMMY SIDEWALL IN SEMICONDUCTOR DEVICE

BACKGROUND

A semiconductor device typically includes a gate on a semiconductor substrate, spacers on sidewalls of the gate, and source and drain regions on opposed sides of the gate and in the semiconductor substrate. The width of the spacers determines the distance between the source and drain regions. Therefore, many functional device characteristics and parameters, such as the transistor saturation current, $I_{sat}$, are highly dependent upon the spacer width. How to precisely produce the spacers having desired width becomes an important issue in the manufacturing process of the semiconductor device.

The spacers are conventionally produced by forming at least one dielectric layer over the gate, and performing an anisotropic dry etch process, so as to form the spacers along the sidewalls of the gate. Generally, etch time of the anisotropic dry etch process is determined by a thickness of the dielectric layer and a target spacer width. However, a variability of an actual width of the formed spacer between respective lots is still a problem needing to be addressed. Accordingly, there is a need for a method for accurately producing spacers with lower variability.

BRIEF DESCRIPTION OF THE DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

The singular forms "a," "an" and "the" used herein include plural referents unless the context clearly dictates otherwise. Therefore, reference to, for example, a buffer layer includes embodiments having two or more such buffer layers, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

Figure 1A:
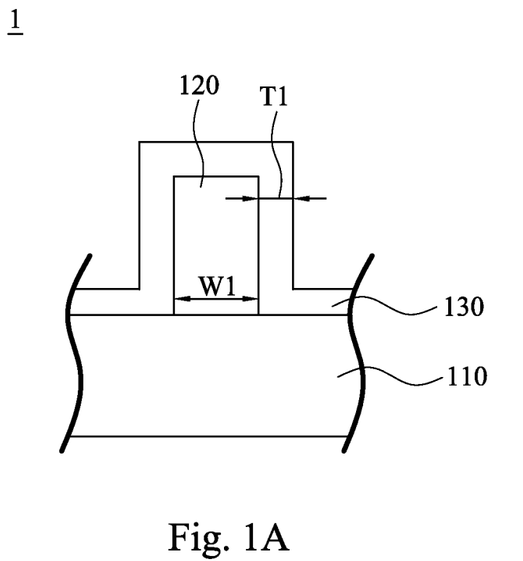
FIGS. 1A-1B are cross-sectional views at various stages of forming a spacer of a semiconductor device according to various embodiments of the present disclosure.
Figure 1B:
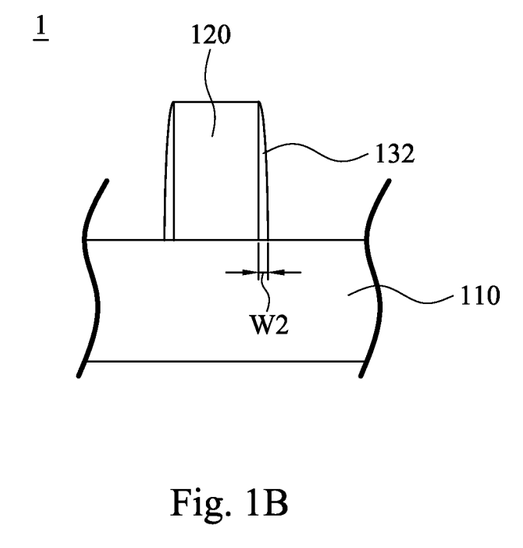

FIGS. 1A-1B are cross-sectional views at various stages of forming a spacer of a semiconductor device according to various embodiments of the present disclosure. As shown in FIG. 1A, a gate 120 is formed on a semiconductor substrate 110, and a dielectric layer 130 is then formed covering the gate 120 and an upper surface of the semiconductor substrate 110. As shown in FIG. 1B, a trimming process, such as an anisotropic dry etch process, is then performed on the dielectric layer 130 so as to form spacers 132 along sidewalls of the gate 120. After performing the trimming process, an actual width W2 of the spacer 132 is measured. Generally, the trimming process has process conditions needing to be controlled, such as a trim rate and a trim time. The trim time is typically determined by a thickness T1 of the dielectric layer 130, a target spacer width and the trim rate. However, there exists a variability of the actual spacer width W2 between respective lots. Therefore, how to reduce the variability of the actual spacer width W2 between respective lots is still a problem to be addressed.

In order to reduce the variability of the actual spacer width W2 between respective lots, a relationship between the spacer width W2 and other critical dimensions of elements is studied. It is found that the width W1 of the gate 120 also affects the spacer width W2. The spacer width W2 increases with the increasing of the width W1 of the gate 120. Thus, in the embodiment, a novel advanced process control (APC) method controlled by both the width W1 of the gate 120 and the thickness T1 of the dielectric layer 130, which are acted as feed forward factors, is provided. The APC method includes a step of determining the trim time of the trimming process based on the width W1 of the gate 120 and the thickness T1 of the dielectric layer 130 to reduce influence of the width W1 of the gate 120 on the spacer width W2, and thus to decrease the variability of the spacer width W2 between respective lots.

Figure 2:
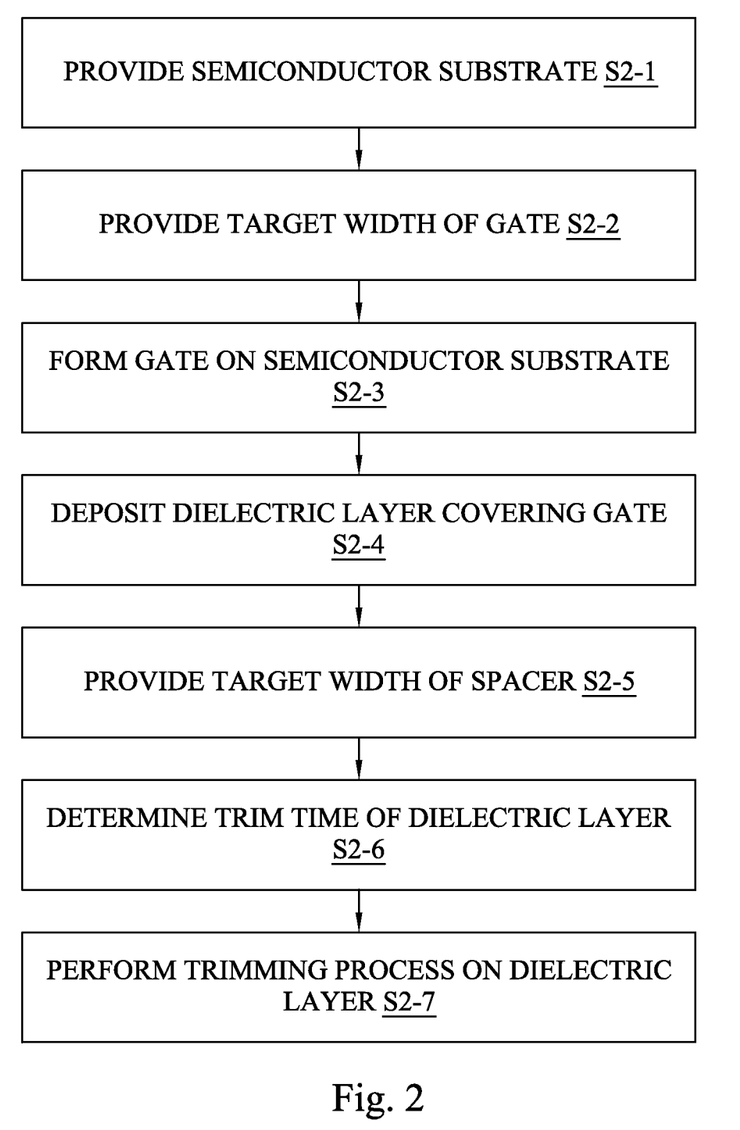
FIG. 2 is a flow chart illustrating an advanced process control (APC) method for controlling a width of a spacer in a semiconductor device according to FIGS. 1A-1B of the various embodiments of the present disclosure.

FIG. 2 is a flow chart illustrating an APC method for controlling the spacer width W2 in the semiconductor device 1 according to the various embodiments of the present disclosure in FIGS. 1A-1B. As shown in FIGS. 1-2, in operation S2-1, the semiconductor substrate 110 is provided. The semiconductor substrate 110 may include an elementary semiconductor including silicon or germanium in crystal, polycrystalline, and/or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or combinations thereof. In various embodiments, the semiconductor substrate 110 may include various doping configurations depending on design requirements as known in the art, such as p-type substrate regions or n-type substrate regions. In some embodiments, the semiconductor substrate 110 may include doped regions. The doped regions may be doped with p-type dopants (e.g., boron) and/or n-type dopants (e.g., phosphorus or arsenic). The semiconductor substrate 110 may further include various active regions, such as regions configured for an N-type metal-oxide-semiconductor transistor device (NMOS device) and regions configured for a P-type metal-oxide-semiconductor transistor device (PMOS device).

In operation S2-2, a target width of the gate is provided. In operation S2-3, the gate 120 is then formed on the semiconductor substrate 110, in which the gate 120 has a measured width W1, as shown in FIG. 1A. For examples, a gate layer (not shown) may be formed over the semiconductor substrate 110 by any suitable process, and then patterned to form the gate 120. The process for forming the gate layer may be chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), sputtering, plating, spin-on coating and/or combinations thereof. The process for patterning the gate layer may be conventional photolithography and etching processes or other suitable processes. The patterning process should be controlled to obtain the gate 120 having the width W1 close to the target gate width.

The gate layer may by a single conductive layer or stack layers. In various embodiments, the single gate layer includes polysilicon (poly), metal, metal alloy, and/or combinations thereof. In various embodiments, the stack layers include one or more high-k dielectric layers, work function layers, conductive layers, hard mask layers, other suitable layers, and/or combinations thereof. The high-k dielectric layer may include a high-k dielectric material, such as hafnium oxide (HfO$_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium oxide-alumina (HfO$_2$—Al$_2$O$_3$) alloy, and/or combinations thereof. The work function layer may include TiN, WN, W, TiAl, TiAlN, TaCN, and/or combinations thereof. The conductive layer may include polysilicon, metal, metal alloy, and/or combinations thereof. The hard mask layer may include silicon nitride or a multi-layer structure of silicon oxide and silicon nitride, and may be located at the top of the stack layers so as to act as a capping layer.

Subsequently, in operation S2-4, the dielectric layer 130 is deposited covering the gate 120, in which the dielectric layer 130 has a measured thickness T1, as shown in FIG. 1A. The dielectric layer 130 may be made of silicon oxide, silicon nitride or other high k dielectric materials. The dielectric layer 130 may be formed by CVD, PECVD, low pressure CVD (LPCVD), atmosphere pressure CVD (APCVD), and/or combinations thereof.

In operation S2-5, a target width of the spacer is provided. In operation S2-6, the trim time of the dielectric layer 130 is then determined based on the target width of the gate 120, the measured width W1 of the gate 120, the target width of the spacer, and the measured thickness T1 of the dielectric layer 130. In various embodiments, the trim time of the dielectric layer 130 is determined by calculating the model (1): (the measured thickness T1 of the dielectric layer 130–the target width of the spacer)+n(the measured width W1 of the gate 120–the target width of the gate 120)=(a trim rate of the dielectric layer 130)×(the determined trim time)+b, in which n is less than 1, and b represents a control offset value.

In various embodiments, "n" is determined by developing a correlation between width of gate and width of spacer before determining the trim time of the dielectric layer 130 (i.e., operation S2-6). The correlation may be obtained by processing a plurality of semiconductor devices, that the trimming process is controlled by a typical APC method. The steps of processing the semiconductor devices are described in detail below. The semiconductor devices are provided, and each of the semiconductor devices has a gate and a dielectric layer covering the gate, such as the semiconductor device 1 of FIG. 1A. However, the trim time of the dielectric layer is determined based on the thickness of the dielectric layer and a target spacer width. Specifically, the trim time is calculated by the model (2): (the measured thickness of the dielectric layer–the target width of the spacer)=(a trim rate of the dielectric layer)×(the determined trim time)+b. Subsequently, the trimming process is performed on the dielectric layer for the determined trim time to form the spacer. Finally, the width of the spacer is measured. The experimental data of a measured width of the gate and the measured width of the spacer is collected. A regression line of the experimental data is then developed to find out the relationship between the width of the gate and the width of the spacer. The higher the slope of the regression line, the greater the influence of the width of the gate on the width of the spacer. Thus, the slope of the regression line can be acted as "n" of the model (1).

In operation S2-7, the trimming process is performed on the dielectric layer 130 for the determined trim time derived from the model (1) to form the spacer 132. The variability of the actual spacer width W2 between respective lots controlled by the model (1) may be lower than that controlled by the model (2) (i.e., the typical APC method) since the model (1) concerns the width W1 of the gate 120 but the model (2) does not concern it.

In various embodiments, after operation S2-7, the width W2 of the spacer 132 is measured, and then fed back to the step of determining the trim time of the dielectric layer 130 (i.e., operation S2-6) to determine "b" of the model (1). In other words, "b" is derived from a feedback function, which is a relation function between the measured width W2 of the spacer 132 and the target spacer width.

Figure 3A:
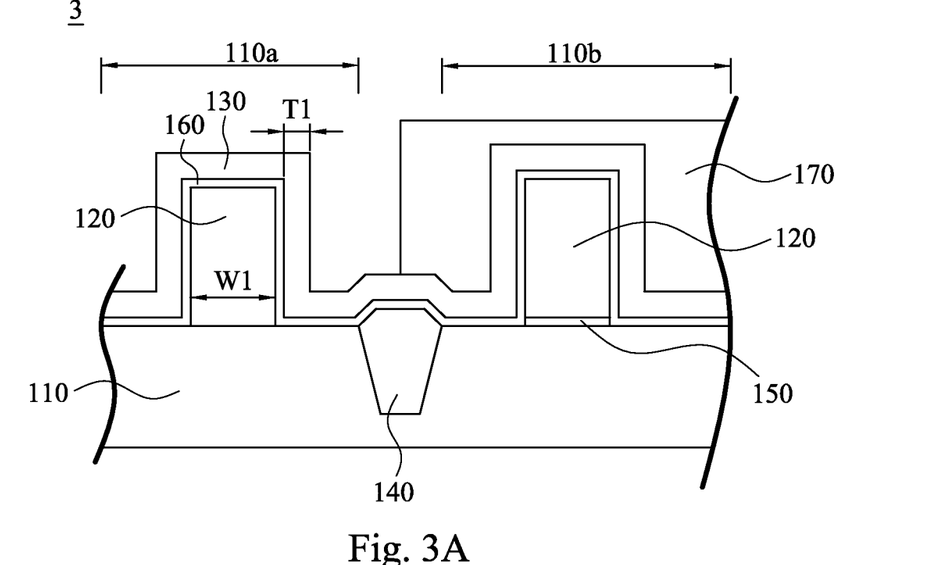
FIGS. 3A-3B are cross-sectional views at various stages of forming a dummy sidewall of a semiconductor device according to various embodiments of the present disclosure.
Figure 3B:
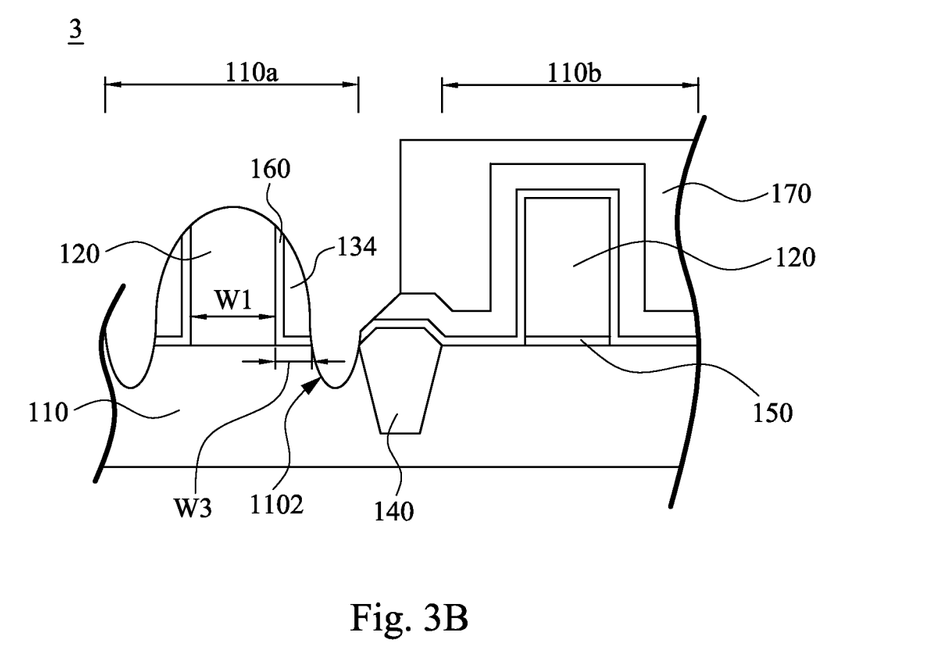
Figure 4:
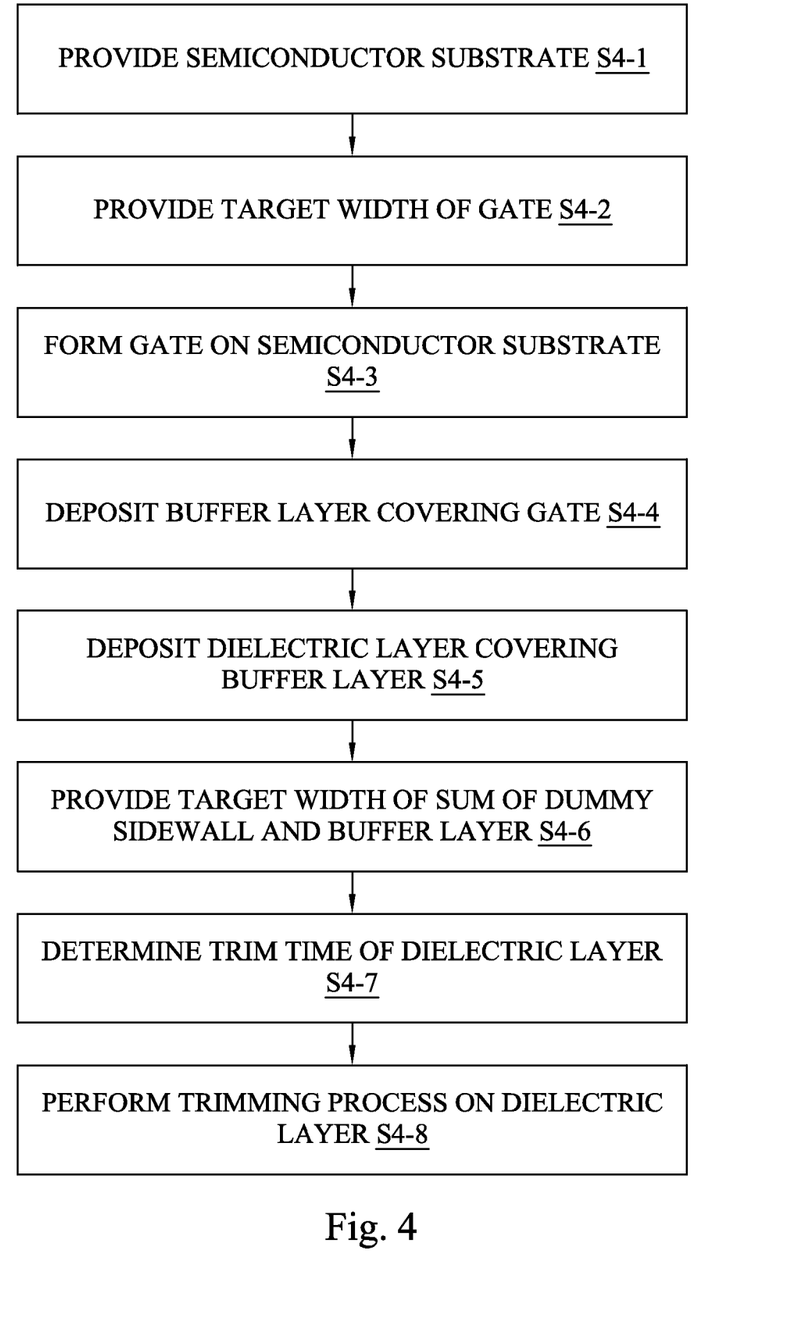
FIG. 4 is a flow chart illustrating an APC method for controlling a width of a dummy sidewall in a semiconductor device according to FIGS. 3A-3B of the various embodiments of the present disclosure.

FIGS. 3A-3B are cross-sectional views at various stages of forming a dummy sidewall of a semiconductor device according to various embodiments of the present disclosure. FIG. 4 is a flow chart illustrating an APC method for controlling a width of the dummy sidewall in the semiconductor device according to the various embodiments of the present disclosure in FIGS. 3A-3B.

In operation S4-1, as shown in FIGS. 3A and 4, a semiconductor substrate 110 is provided. The specific features of the semiconductor substrate 110 may be referred to those illustrated for the semiconductor substrate 110 of FIG. 1A.

An isolation region 140 is then formed in the semiconductor substrate 110, which can be used to define various regions of the semiconductor substrate 110. For an example, the isolation region 140 is used to define PMOS and NMOS device regions 110a, 110b. The isolation region 140 may utilize isolation technology, such as LOCOS or STI, to define and electrically isolate the PMOS and NMOS device regions 110a, 110b. The isolation region 140 may include silicon oxide, silicon nitride, silicon oxynitride, a low-k dielectric material, and/or a combination thereof. Subsequently, a gate dielectric layer 150 is formed on the NMOS device region 110b of the semiconductor substrate 110. The gate dielectric layer 150 may be formed by any conventional process.

In operation S4-2, a target width of a gate is provided. In operation S4-3, the gate 120 is then formed on the semiconductor substrate 110, in which the gate 120 has a measured width W1. The specific features of the gate 120 may be referred to those illustrated for the gate 120 of FIG. 1A. The gate 120 on the PMOS device portion 110a is a portion of a PMOS device.

In operation S4-4, a buffer layer 160 is deposited covering the gates 120. The buffer layer 160 may include silicon oxide. In various embodiments, the buffer layer 160 is made of TEOS. In various embodiments, the buffer layer 160 has a thickness of 10-50 angstroms.

In operation S4-5, a dielectric layer 130 is deposited covering the buffer layer 160, in which the dielectric layer 130 has a measured thickness T1. The specific features of the dielectric layer 130 may be referred to those illustrated for the dielectric layer 130 of FIG. 1A. In various embodiments, the dielectric layer 130 has a thickness of 130-190 nm. The adhesive property between the dielectric layer 130 and the gate 120 may be improved by the buffer layer 160.

In operation S4-6, a target width of sum of the dummy sidewall and the buffer layer 160 is provided. In operation S4-7, a trim time of the dielectric layer 130 is determined based on the target width of the gate 120, the measured width W1 of the gate 120, the target width of sum of the dummy sidewall and the buffer layer 160, and the measured thickness T1 of the dielectric layer 130. In various embodiments, the trim time of the dielectric layer 130 is determined by calculating the model (3): (the measured thickness T1 of the dielectric layer 130−the target width of sum of the dummy sidewall and the buffer layer 160)+n(the measured width W1 of the gate 120−the target width of the gate 120)=(a trim rate of the dielectric layer 130)×(the determined trim time)+b, in which n is less than 1, and b represents a control offset value.

In various embodiments, "n" is determined by developing a correlation between width of gate and width of sum of dummy sidewall and buffer layer before determining the trim time of the dielectric layer 130 (i.e., operation S4-7). The correlation may be obtained by processing a plurality of semiconductor devices, that the trim time is controlled by a typical APC method. The steps of processing the semiconductor devices are described in detail below. The semiconductor devices are provided, and each of the semiconductor devices has a gate, a buffer layer covering the gate, and a dielectric layer covering the buffer layer, such as the semiconductor device 3 of FIG. 3A. The trim time of the dielectric layer is determined based on the thickness of the dielectric layer and a target width of sum of the dummy sidewall and the buffer layer. Specifically, the trim time is calculated by the model (4): (the measured thickness of the dielectric layer−the target width of sum of the dummy sidewall and the buffer layer)=(a trim rate of the dielectric layer)×(the determined trim time)+b. Subsequently, a trimming process is performed on the dielectric layer for the determined trim time to form the dummy sidewall. Finally, the width of sum of the dummy sidewall and the buffer layer is measured. The experimental data of a measured width of the gate and the measured width of sum of the dummy sidewall and the buffer layer is collected. A regression line of the experimental data is then developed to find out the relationship between the width of the gate and the width of sum of the dummy sidewall and the buffer layer. The higher the slope of the regression line, the greater the influence of the width of the gate on the width of sum of the dummy sidewall and the buffer layer. Thus, the slope of the regression line can be acted as "n" of the model (3). In various embodiments, n is in a range of 0.20 to 0.32.

In operation S4-8, a trimming process is performed on the dielectric layer 130 for the determined trim time derived from the model (3) to form the dummy sidewall 134. After operation S4-8, a width W3 of sum of the dummy sidewall 134 and the buffer layer 160 is measured. The variability of the width W3 between respective lots controlled by the model (3) may be lower than that controlled by the model (4) (i.e., the typical APC method) since the model (3) concerns the width W1 of the gate 120 but the model (4) does not concern it.

The width W3 of sum of the dummy sidewall 134 and the buffer layer 160 may be fed back to the step of determining the trim time of the dielectric layer 130 (i.e., operation S4-7) to determine "b" of the model (3). In other words, "b" is derived from a feedback function, which is a relation function between the measured width W3 of sum of the dummy sidewall 134 and the buffer layer 160 and the target width thereof.

In various embodiments, before operation S4-8, a photoresist 170 is formed covering the NMOS device region 110b, as shown in FIG. 3A. After operation S4-8, the PMOS device region 110a of the semiconductor substrate 110 is etched by using the gate 120, the buffer layer 160 and the dummy sidewall 134 as a mask to form a cavity 1102, as shown in FIG. 3B. An embedded stressor material (not shown) such as silicon-germanium (SiGe) may be then filled in the cavity 1102.

Figure 5A:
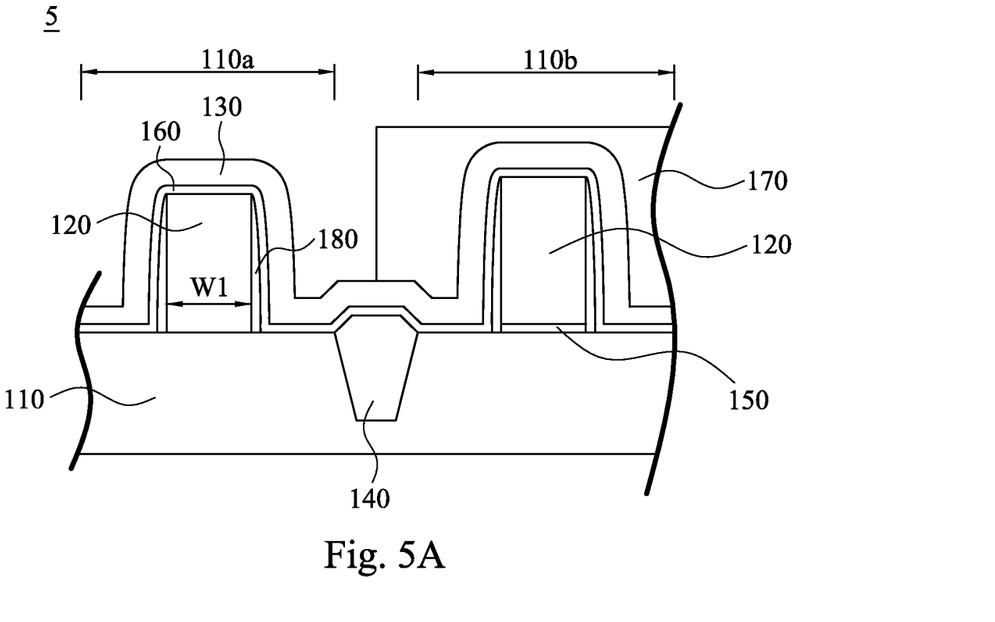
FIGS. 5A-5B are cross-sectional views at various stages of forming a dummy sidewall of a semiconductor device according to various embodiments of the present disclosure.
Figure 5B:
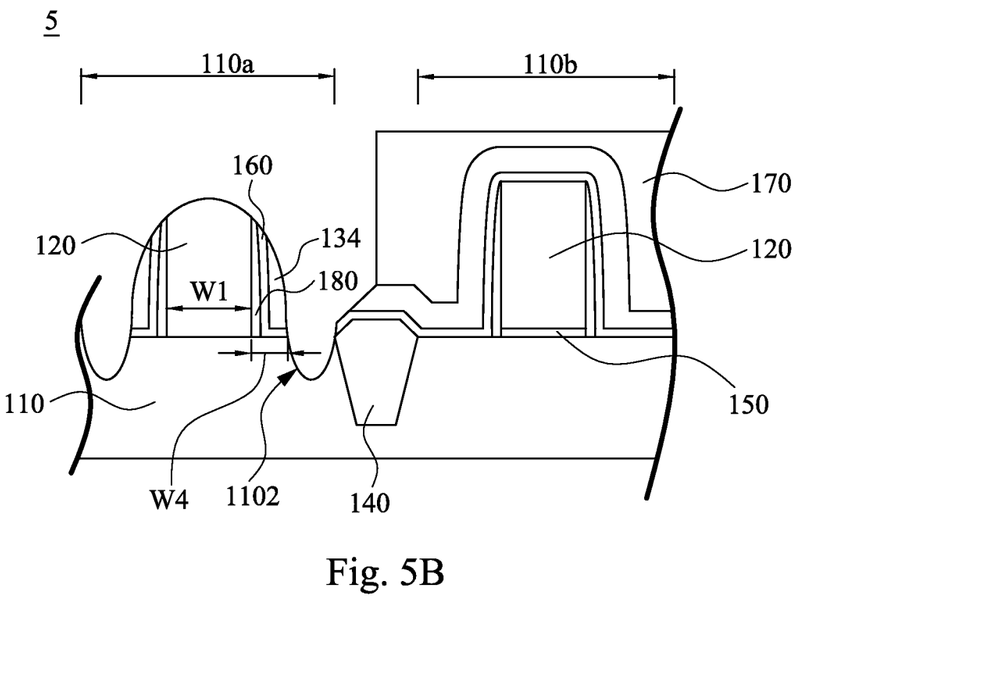
Figure 6:
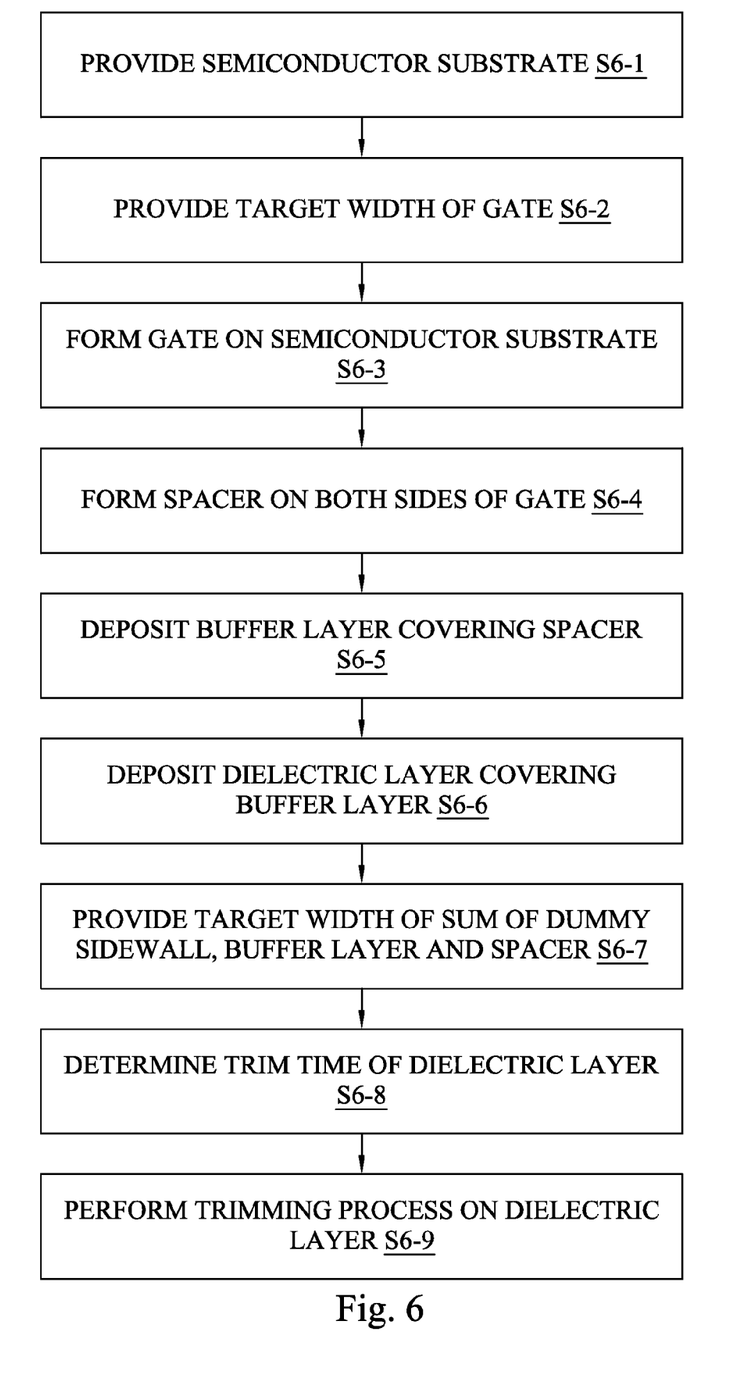
FIG. 6 is a flow chart illustrating an APC method for controlling a width of a dummy sidewall in a semiconductor device according to FIGS. 5A-5B of the various embodiments of the present disclosure.

FIGS. 5A-5B are cross-sectional views at various stages of forming a dummy sidewall of a semiconductor device according to various embodiments of the present disclosure. FIG. 6 is a flow chart illustrating an APC method for controlling a width of the dummy sidewall in the semiconductor device according to the various embodiments of the present disclosure in FIGS. 5A-5B. The specific features of operations S6-1, S6-2 and S6-3 may be referred to those illustrated for operations S4-1, S4-2 and S4-3 of FIG. 4.

After forming a gate 120 on a semiconductor substrate 110 (i.e., operation S6-3), spacers 180, a buffer layer 160 and a dielectric layer 130 are sequentially formed on the gate 120 (i.e., operations S6-4, S6-5 and S6-6). In operation S6-4, the spacers 180 are formed on both sides of the gate 120 by any suitable process. The spacers 180 may have a substantially same function as the spacers 132 of FIG. 1B. In operation S6-5, the buffer layer 160 is deposited covering the spacers 180 and the top of the gate 120. In operation S6-6, the dielectric layer 130 is deposited covering the buffer layer 160. The specific features of operations S6-5 and S6-6 may be referred to those illustrated for operations S4-4 and S4-5 of FIG. 4.

In operation S6-7, a target width of sum of the dummy sidewall, the buffer layer 160 and the spacer 180 is provided.

In operation S6-8, a trim time of the dielectric layer 130 is determined based on the target width of the gate 120, the measured width of the gate 120, the target width of sum of the dummy sidewall, the buffer layer 160 and the spacer 180, and the measured thickness T1 of the dielectric layer 130. In various embodiments, the trim time of the dielectric layer 130 is determined by calculating the model (5): (the measured thickness T1 of the dielectric layer 130–the target width of sum of the dummy sidewall, the buffer layer 160 and the spacer 180)+n(the measured width W1 of the gate 120–the target width of the gate 120)=(a trim rate of the dielectric layer 130)×(the determined trim time)+b, in which n is less than 1, and b represents a control offset value.

In various embodiments, "n" is determined by developing a correlation between width of gate and width of sum of dummy sidewall, buffer layer and spacer before determining the trim time of the dielectric layer 130 (i.e., operation S6-8). The correlation may be obtained by processing a plurality of semiconductor devices, that the trim time is controlled by a typical APC method. The steps of processing the semiconductor devices are described in detail below. The semiconductor devices are provided, and each of the semiconductor devices has a gate, a spacer on both sides of the gate, a buffer layer covering the spacer, and a dielectric layer covering the buffer layer, such as the semiconductor device 5 of FIG. 5A. The trim time of the dielectric layer is determined based on the thickness of the dielectric layer and a target width of sum of the dummy sidewall, buffer layer and spacer. Specifically, the trim time is calculated by the model (6): (the measured thickness of the dielectric layer–the target width of sum of the dummy sidewall, buffer layer and spacer)=(a trim rate of the dielectric layer)×(the determined trim time)+b. Subsequently, a trimming process is performed on the dielectric layer for the determined trim time to form the dummy sidewall. Finally, the width of sum of the dummy sidewall, buffer layer and spacer is measured. The experimental data of a measured width of the gate and the measured width of sum of the dummy sidewall, buffer layer and spacer is collected. A regression line of the experimental data is then developed to find out the relationship between the width of the gate and the width of sum of the dummy sidewall, buffer layer and spacer. The higher the slope of the regression line, the greater the influence of the width of the gate on the width of sum of the dummy sidewall, buffer layer and spacer. Thus, the slope of the regression line may be acted as "n" of the model (5). In various embodiments, n is in a range of 0.20 to 0.32.

In operation S6-9, a trimming process is performed on the dielectric layer 130 for the determined trim time derived from the model (5) to form the dummy sidewall 134. After operation S6-9, a width W4 of sum of the dummy sidewall 134, buffer layer 160 and spacer 180 is measured. The variability of the width W4 between respective lots controlled by the model (5) may be lower than that controlled by the model (6) (i.e., the typical APC method) since the model (5) concerns the width W1 of the gate 120 but the model (6) does not concern it.

The width W4 of sum of the dummy sidewall 134, buffer layer 160 and spacer 180 may be fed back to the step of determining the trim time of the dielectric layer 130 (i.e., operation S6-9) to determine "b" of the model (5). In other words, "b" is derived from a feedback function, which is a relation function between the measured width W4 of sum of the dummy sidewall 134, buffer layer 160 and spacer 180 and the target width thereof.

In various embodiments, before operation S6-9, a photoresist 170 is formed covering the NMOS device region 110*b*, as shown in FIG. 5A. After operation S6-9, the PMOS device region 110*a* of the semiconductor substrate 110 is etched by using the gate 120, the spacer 180, the buffer layer 160 and the dummy sidewall 134 as a mask to form a cavity 1102, as shown in FIG. 5B. An embedded stressor material (not shown) such as silicon-germanium (SiGe) may be then filled in the cavity 1102.

Figure 7:
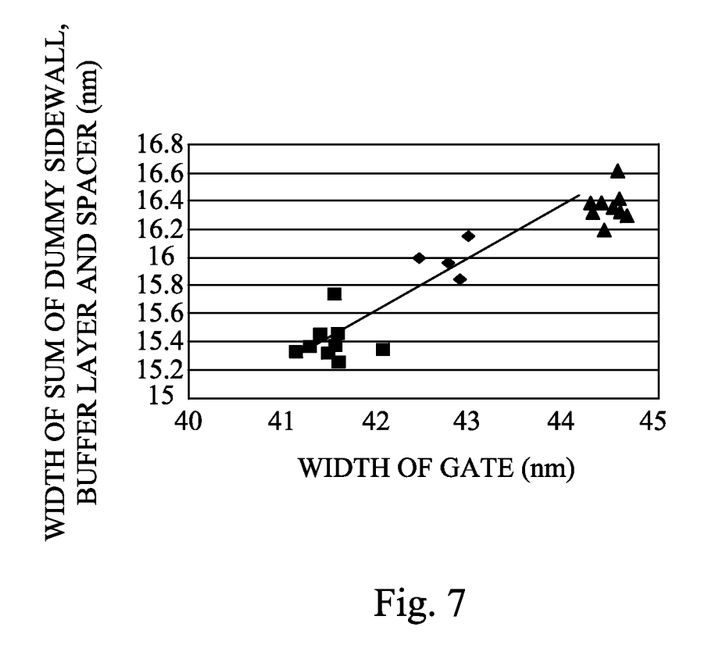
FIG. 7 is a relationship diagram between width of sum of dummy sidewall, buffer layer and spacer, and width of gate according to various embodiments of the present disclosure.

FIG. 7 is a relationship diagram between width of sum of dummy sidewall, buffer layer and spacer, and width of gate according to various embodiments of the present disclosure. The correlation shown in FIG. 7 is obtained by processing a plurality of semiconductor devices 5 of FIG. 5A, that the trim time of the trimming process is controlled by the model (6) (i.e., the typical APC method). The semiconductor devices 5 respectively have various widths W1 of the gates 120, which are controlled by using different process conditions of the step of forming the gate 120. As shown in FIG. 7, the widths W1 of the gates 120 can be substantially classified into three groups sequentially marked by ■, ♦, and ▲. After performing the trimming process controlled by the typical APC method, the semiconductor devices 5 respectively exhibit different widths W4 of sum of the dummy sidewall 134, buffer layer 160 and spacer 180. A regression line of the experimental data shown in FIG. 7 has a function of y=0.3163x+2.3102 and $R^2$=0.9122, which represents that the width W4 is highly dependent on the width W1 of the gate 120. Therefore, "n" of the model (5) can be set as 0.3163.

Figure 8:
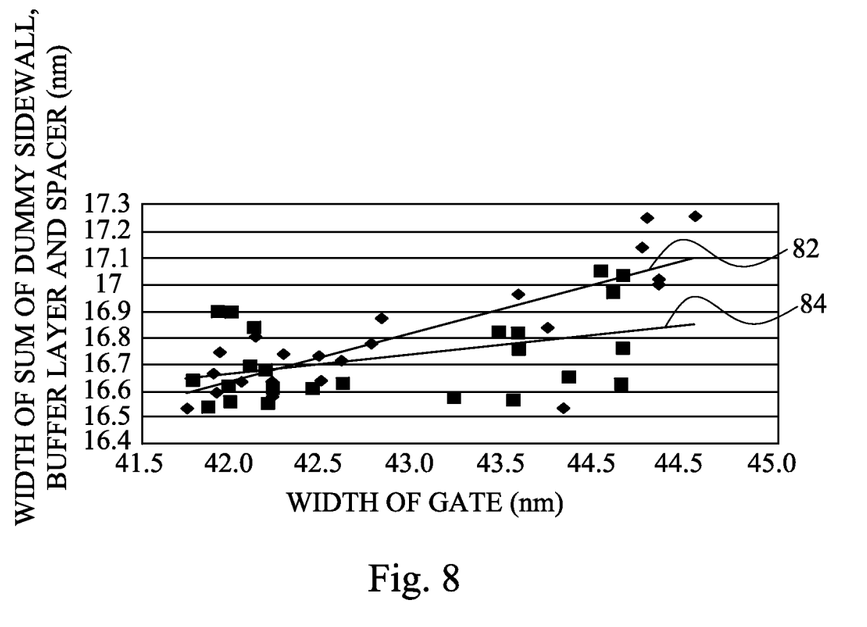
FIG. 8 is a relationship diagram between width of sum of dummy sidewall, buffer layer and spacer, and width of gate according to a comparative embodiment (marked by ♦) and the various embodiments of the present disclosure of FIGS. 5A-5B (marked by ■).

FIG. 8 is a relationship diagram between width of sum of dummy sidewall, buffer layer and spacer, and width of gate according to a comparative embodiment (marked by ♦) and the various embodiments of the present disclosure of FIGS. 5A-5B (marked by ■). The trimming process of the embodiments of FIGS. 5A-5B and the comparative embodiment are respectively controlled by the models (5) and (6), and "n" of the model (5) is set as 0.20. The result indicates that a regression line 84 of the embodiments of FIGS. 5A-5B has a slope of 0.0725, which is significantly lower than the slope of 0.1796 of a regression line 82 of the comparative embodiment, and thus proves the model (5) exhibit better process control effect. In addition, a ratio of out of control is reduced from 1.5% of the comparative embodiment to 1.0% of the embodiments of FIGS. 5A-5B. Given the above, the APC method of the present disclosure indeed can be used to reduce the variability of the width W4 of FIG. 5B between respective lots.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An APC method for controlling a width of a dummy sidewall in a semiconductor device, the method comprising:
   providing a semiconductor substrate;
   providing a target width of a gate;
   forming the gate on the semiconductor substrate, wherein the gate has a measured width;
   depositing a buffer layer covering the gate;
   depositing a dielectric layer covering the buffer layer, wherein the dielectric layer has a measured thickness;

providing a target width of sum of the dummy sidewall and the buffer layer;
determining a trim time of the dielectric layer based on the target width of the gate, the measured width of the gate, the target width of sum of the dummy sidewall and the buffer layer, and the measured thickness of the dielectric layer; and
performing a trimming process on the dielectric layer for the determined trim time to form the dummy sidewall.

2. The method of claim 1, wherein determining the trim time of the dielectric layer is conducted by calculating the model: (the measured thickness of the dielectric layer−the target width of sum of the dummy sidewall and the buffer layer)+n(the measured width of the gate−the target width of the gate)=(a trim rate of the dielectric layer)×(the determined trim time)+b, wherein n is less than 1, and b represents a control offset value.

3. The method of claim 2, further comprising developing a correlation between width of gate and width of sum of dummy sidewall and buffer layer to determine n before determining the trim time of the dielectric layer.

4. The method of claim 3, further comprising:
providing a plurality of semiconductor devices, each of the semiconductor devices having a gate, a buffer layer covering the gate, and a dielectric layer covering the buffer layer, wherein the gate has a width;
determining a trim time of the dielectric layer based on a thickness of the dielectric layer;
performing a trimming process on the dielectric layer for the determined trim time to foini the dummy sidewall; and
measuring a width of sum of the dummy sidewall and the buffer layer before developing the correlation between the width of the gate and the width of sum of the dummy sidewall and the buffer layer.

5. The method of claim 3, wherein developing the correlation between the width of the gate and the width of sum of the dummy sidewall and the buffer layer to determine n is conducted by developing a regression line of the correlation to obtain a slope acted as n.

6. The method of claim 5, wherein n is in a range of 0.20 to 0.32.

7. The method of claim 2, further comprising:
measuring a width of sum of the dummy sidewall and the buffer layer after performing the trimming process on the dielectric layer; and
feeding back the width of sum of the dummy sidewall and the buffer layer to the step of determining the trim time of the dielectric layer to determine b.

8. The method of claim 1, further comprising etching the semiconductor substrate by using the gate, the buffer layer and the dummy sidewall as a mask to form a cavity after performing the trimming process on the dielectric layer.

9. The method of claim 1, wherein the gate is a portion of a PMOS device.

10. The method of claim 1, wherein the buffer layer includes silicon oxide.

11. The method of claim 1, wherein the buffer layer is made of TEOS.

12. The method of claim 1, wherein the buffer layer has a thickness of 10-50 angstroms.

13. The method of claim 1, wherein the dielectric layer is made of silicon oxide or silicon nitride.

14. The method of claim 1, wherein the dielectric layer has a thickness of 130-190 nm.

15. The method of claim 8, further comprising filling an embedded stressor material in the cavity after etching the semiconductor substrate by using the gate, the buffer layer and the dummy sidewall as the mask to form the cavity.

16. The method of claim 15, wherein the embedded stressor material is silicon-germanium (SiGe).

17. The method of claim 2, wherein the control offset value is derived from a feedback function between the measured width of sum of the dummy sidewall and the buffer layer, and the target width of sum of the dummy sidewall and the buffer layer.

18. The method of claim 1, further comprising forming an isolation region in the semiconductor substrate to define a PMOS region and a NMOS region.

19. The method of claim 1, wherein forming the gate on the semiconductor substrate comprises:
forming a gate layer over the semiconductor substrate; and
patterning the gate layer to form the gate.

20. The method of claim 19, wherein the gate layer includes polysilicon, metal, metal alloy or a combination thereof.

* * * * *